United States Patent [19]
Wakatsuki et al.

[11] Patent Number: 5,628,099
[45] Date of Patent: May 13, 1997

[54] METHOD OF PRODUCING SERIES-RESONANT DEVICE USING CONDUCTIVE ADHESIVE RESIN

[75] Inventors: Noboru Wakatsuki; Masaaki Ono; Kenji Fukayama; Masanori Yachi, all of Kawasaki, Japan

[73] Assignee: Fujitsu Limited, Kawasaki, Japan

[21] Appl. No.: 405,982

[22] Filed: Mar. 17, 1995

[30] Foreign Application Priority Data

Mar. 18, 1994  [JP]  Japan ................. 6-048389

[51] Int. Cl.⁶ ............... H01L 41/00; H05K 13/00
[52] U.S. Cl. ............. 29/25.35; 29/841; 29/855; 156/273.9
[58] Field of Search ................ 29/25.35, 832, 29/841, 855, 854; 156/272.2, 273.9, 275.7

[56] References Cited

U.S. PATENT DOCUMENTS

| | | | |
|---|---|---|---|
| 2,388,242 | 11/1945 | Arndt | 156/273.9 X |
| 2,393,429 | 1/1946 | Swinehart | 156/273.9 X |
| 2,487,985 | 11/1949 | Ruben | 156/273.9 X |
| 3,397,278 | 8/1968 | Pomernatz | 156/273.9 X |
| 4,047,998 | 9/1977 | Yoshikawa et al. | 156/273.9 X |
| 4,961,345 | 10/1990 | Tsuruoka et al. | 73/32 A |
| 5,328,087 | 7/1994 | Nelson et al. | 156/273.9 X |
| 5,406,682 | 4/1995 | Zimnicki et al. | 29/25.35 |

FOREIGN PATENT DOCUMENTS 60-91800  5/1985  Japan ................. 156/273.9

*Primary Examiner*—S. Thomas Hughes
*Attorney, Agent, or Firm*—Armstrong, Westerman, Hattori, McLeland & Naughton

[57] ABSTRACT

A method of producing a device including an impedance element provided so as to effect a series resonance, includes a step of connecting connection portions such as terminals or electrodes to be electrically connected in the device, using conductive adhesive resin. This step of connecting connection portions includes a sub-step of applying an alternating current signal which has a frequency lying in close vicinity of a resonant frequency of the device, and which has an enough amplitude to destroy an insulation film parasitically formed in the conductive adhesive resin, to input/output terminals of the device. By executing the sub-step, it is possible to substantially remove a fluctuation in impedance characteristics in dependence on the driving level, and thus to realize a stable operation of the device.

10 Claims, 7 Drawing Sheets

METHOD OF PRODUCING SERIES-RESONANT DEVICE USING CONDUCTIVE ADHESIVE RESIN

BACKGROUND OF THE INVENTION

1. Field of the Invention

The present invention relates to a technique of producing a device including an impedance element provided so as to effect a series resonance. More particularly, it relates to a method of connecting connection portions such as terminals or electrodes to be electrically connected in a piezoelectric device, using conductive adhesive resin.

In general, a piezoelectric device is small-sized and has a small power loss and stable temperature characteristics, compared with a conventional resonance circuit constituted by inductance elements and capacitance elements. Accordingly, such a piezoelectric device is widely utilized in televisions, radios, communication apparatuses, or the like. In particular, piezoelectric devices are preferably used in oscillation circuits, band-pass filters, or the like, and thus they are required to have an analogically wide dynamic range.

2. Description of the Related Art

In piezoelectric devices such as piezoelectric vibrators, it is known that a phenomenon occurs in that electric characteristics of a vibrator fluctuate depending on a driving level of the vibrator in use. Conventionally, however, the cause of occurrence of such a phenomenon has been unknown. In particular, with respect to a phenomenon in that an input impedance of a vibrator fluctuates depending on a driving power thereof, it has been conceived that the phenomenon has relation to a deterioration in characteristics occurring in the case where the vibrator is applied to an oscillation circuit.

In view of this, in a prior art, a method of testing characteristics of a vibrator by changing a driving level thereof has been adopted. This method, however, poses a problem in that the testing process is troublesome and thus the number of processes becomes large.

Also, the above prior art method poses another problem in that impedance responses (i.e., frequency characteristics) of the vibrator fluctuate depending on the driving level thereof. This imposes restrictions on the manner of choice of a driving power source when the device is in use, and thus is not preferable.

SUMMARY OF THE INVENTION

An object of the present invention is to provide a method of producing a series-resonant device such as a piezoelectric device, by which it is possible to substantially remove a fluctuation in characteristics of a vibrator in dependence on the driving level, and thus to realize a stable operation of the device.

According to the present invention, there is provided a method of producing a device including an impedance element provided so as to effect a series resonance, the method including a step of connecting connection portions such as terminals or electrodes to be electrically connected in the device, using conductive adhesive resin, the step of connecting connection portions including a sub-step of applying an alternating current signal which has a frequency lying in close vicinity of a resonant frequency of the device, and which has an enough amplitude to destroy an insulation film parasitically formed in the conductive adhesive resin, to input/output terminals of the device.

BRIEF DESCRIPTION OF THE DRAWINGS

Other objects and features of the present invention will be described hereinafter in detail by way of preferred embodiments with reference to the accompanying drawings, in which.

DESCRIPTION OF THE PREFERRED EMBODIMENTS

First, for a better understanding of a preferred embodiment of the present invention, the related prior art will be explained with reference to FIGS. 1a to 5.

Figure 1A:
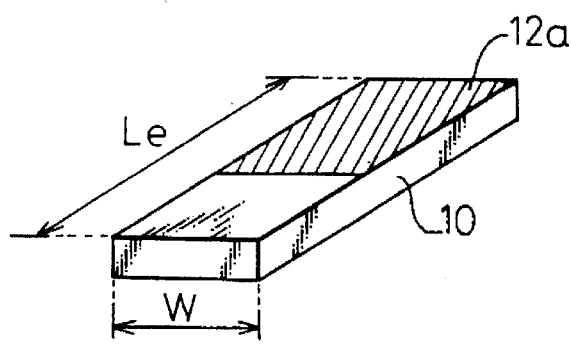
FIGS. 1a to 1c are diagrams showing an example of a typical piezoelectric vibrator.
Figure 1B:
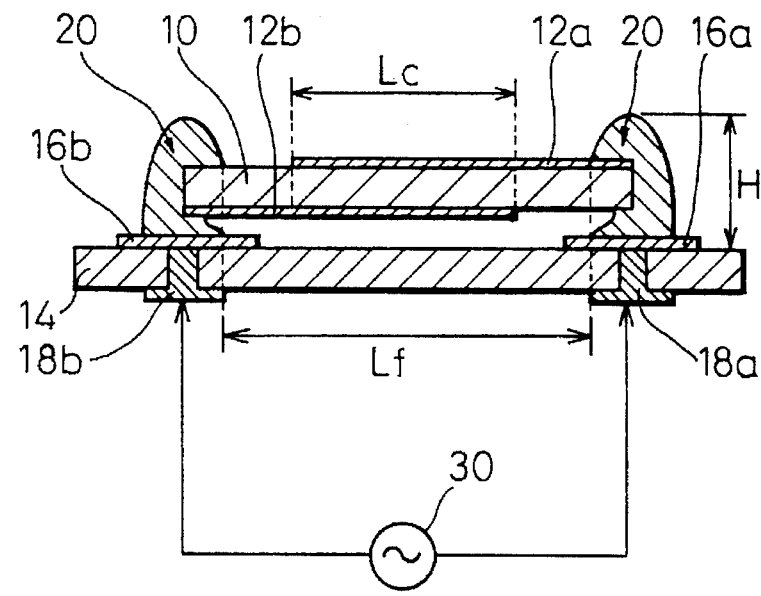
Figure 1C:
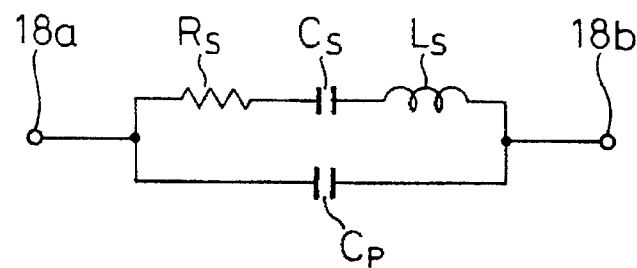

FIGS. 1a to 1c illustrate an example of a typical piezoelectric vibrator. In the illustration, FIG. 1a shows the constitution of the vibrator element; FIG. 1b shows the internal sectional structure of the piezoelectric vibrator; and FIG. 1c shows its equivalent circuit.

In FIGS. 1a to 1c, reference 10 denotes a vibrator element composed of piezoelectric material such as lithium niobate ($LiNbO_3$) or lithium tantalate ($LiTaO_3$); references 12a and 12b each a driving electrode for the vibrator element 10; reference 14 a ceramic substrate for supporting the vibrator element 10; references 16a and 16b each an electrode formed on the ceramic substrate 14; references 18a and 18b each an external electrode connected to the corresponding electrode 16a, 16b; reference 20 a conductive adhesive resin (e.g., silver paste) for fixing and electrically connecting the driving electrodes 12a, 12b formed on the vibrator element 10 to the electrodes 16a, 16b formed on the ceramic substrate 14; and reference 30 a power source for driving the piezoelectric device (piezoelectric vibrator).

Also, reference Le denotes a length of the vibrator element 10; reference W a width of the vibrator element 10; reference Lc an overlapping length of the driving electrodes 12a, 12b; reference Lf a free length of the vibration; and reference H a height of each end electrode of the vibrator element 10.

Also, reference Rs indicates an equivalent series resistance; reference Cs an equivalent series capacitance (acoustic capacitance of the vibrator); reference Ls an equivalent series inductance; and reference Cp an equivalent parallel capacitance (damping capacitance of the vibrator).

In many cases, a frequency range in which an impedance of the piezoelectric vibrator exhibits inductive characteristics is utilized in oscillations or the like.

In piezoelectric devices such as piezoelectric vibrators, a phenomenon occurs in that electric characteristics of a vibrator fluctuate depending on a driving level of the vibrator in use. However, the cause of occurrence of such a phenomenon has been heretofore unknown. In particular, with respect to a phenomenon in that an input impedance of a vibrator fluctuates depending on a driving power thereof, it has been conceived that the phenomenon has relation to a deterioration in characteristics occurring in the case where the vibrator is applied to an oscillation circuit.

In view of this, a method of testing characteristics of a vibrator by changing a driving level thereof has been conventionally adopted. This method, however, poses a problem in that the testing process is troublesome and thus the number of processes becomes large.

Some typical examples of level fluctuation will now be explained with reference to FIGS. 2 to 5. Note, a vibrator which is the object of research is a piezoelectric vibrator of $LiTaO_3$ having a resonant frequency of 9.9 MHz. Also, FIGS. 2 to 5 illustrate frequency characteristics of impedance in dependence on the driving level in the case where the vibrator is driven using a power source with an internal impedance of 50 Ω.

Figure 2:
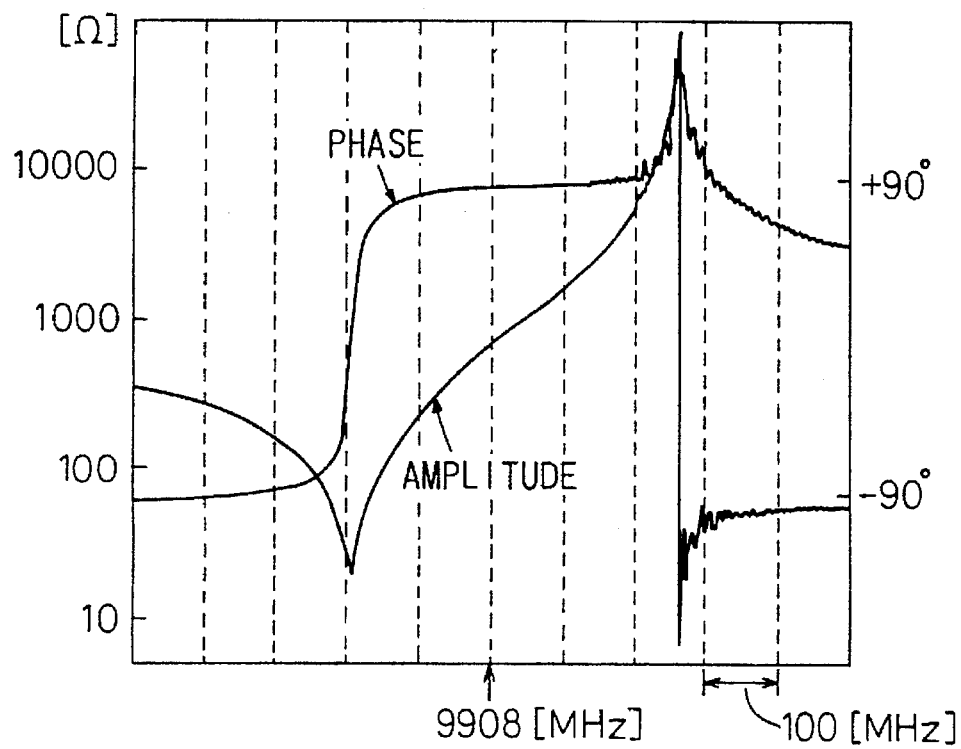
FIG. 2 is a graph showing a first example of a change in impedance characteristics in dependence on the driving level.
Figure 3:
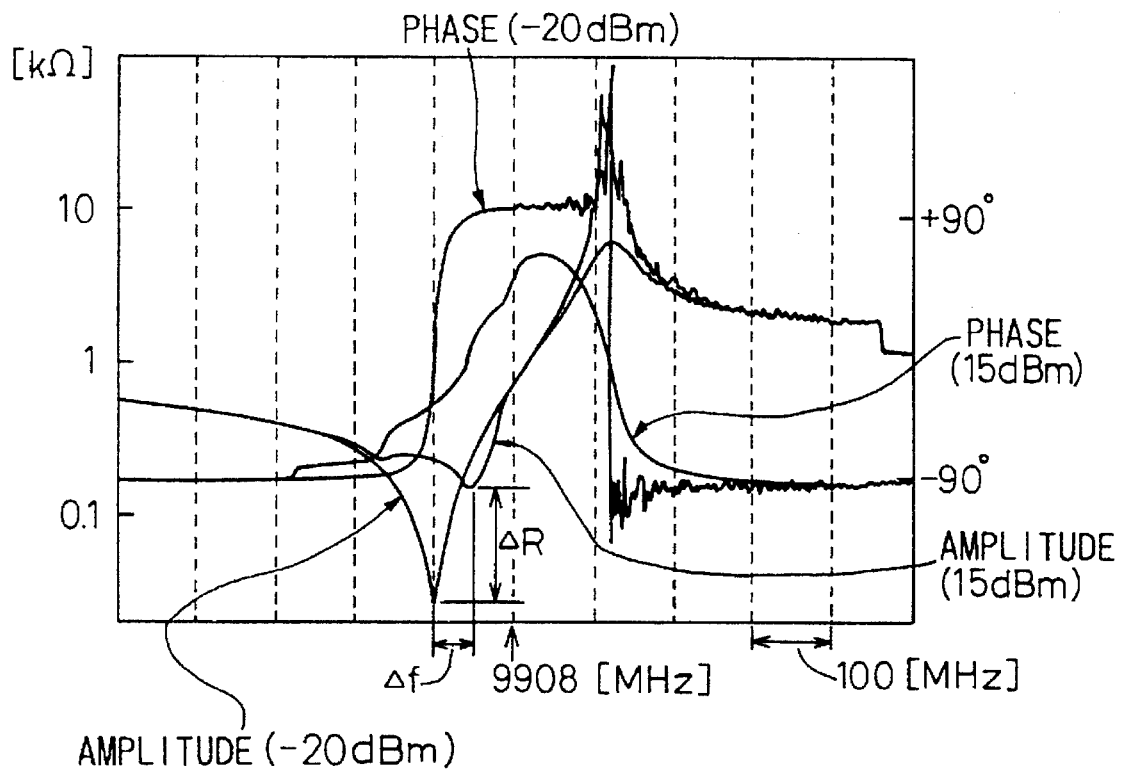
FIG. 3 is a graph showing a second example of a change in impedance characteristics in dependence on the driving level.
Figure 4:
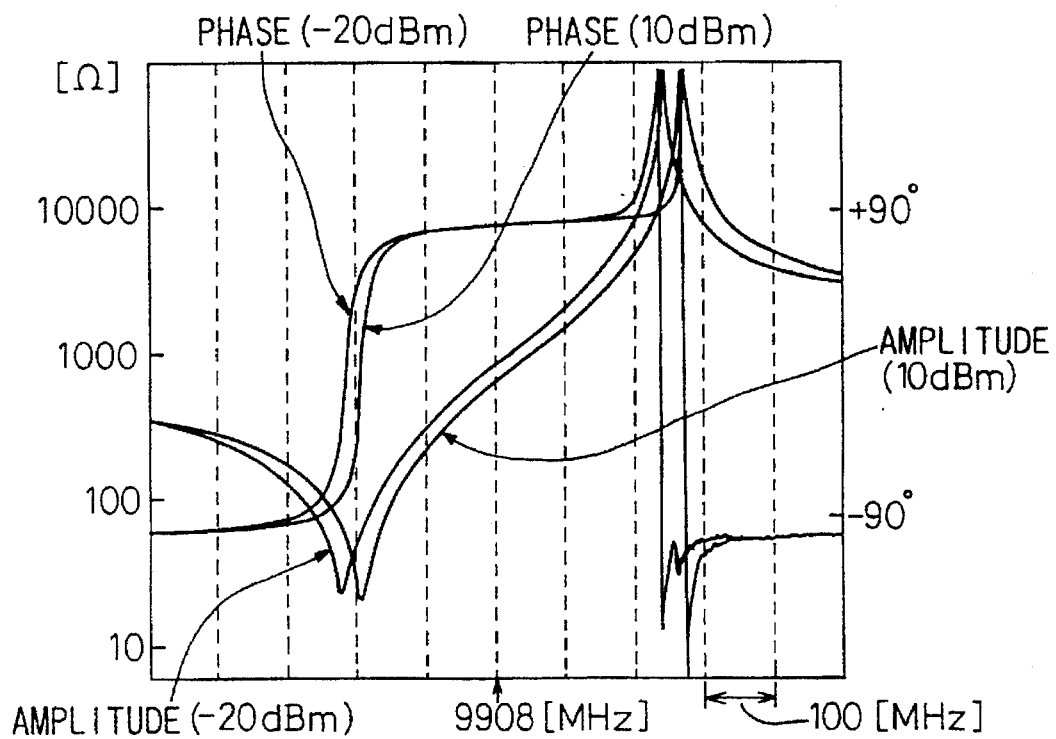
FIG. 4 is a graph showing a third example of a change in impedance characteristics in dependence on the driving level.

Case 1: where the vibrator is driven at low level (−20 dBm) and high level (10 dBm) for discriminating between defective and non-defective (see FIGS. 2 to 4).

FIG. 2 shows impedance characteristics of a vibrator with very little fluctuation, i.e., of a non-defective vibrator. As shown in FIG. 2, there is no fluctuation (shift) of the resonant frequency in dependence on the driving level, and there is very little change in the resonant resistance in dependence on a change in the driving level. Also, a response waveform in the resonant state and a response waveform in the antiresonant state resemble each other.

FIG. 3 shows impedance characteristics of a vibrator with a relatively great fluctuation, i.e., of a defective vibrator. As shown in FIG. 3, there is a great fluctuation of the resonant frequency in dependence on the driving level, and there is a relatively great change in the resonant resistance in dependence on a change in the driving level. In particular, in the low level (−20 dBm) driving, a change in the resonant resistance is remarkably great. Also, a response waveform in the resonant state and a response waveform in the antiresonant state are quite different from each other. It is presumed that an elastic vibration at the driving level of the vibrator is not so large in its non-linear range. In other words, it is impossible to realize the elastic vibration by means of bandpass characteristics, and thus an electrical switching operation is anticipated from the elastic vibration.

FIG. 4 shows impedance characteristics of a vibrator with a somewhat little fluctuation. As shown in FIG. 4, there is a little fluctuation of the resonant frequency in dependence on the driving level, and a change in the resonant resistance in dependence on a change in the driving level is approximately 5 or 6 Ω at highest.

Figure 5:
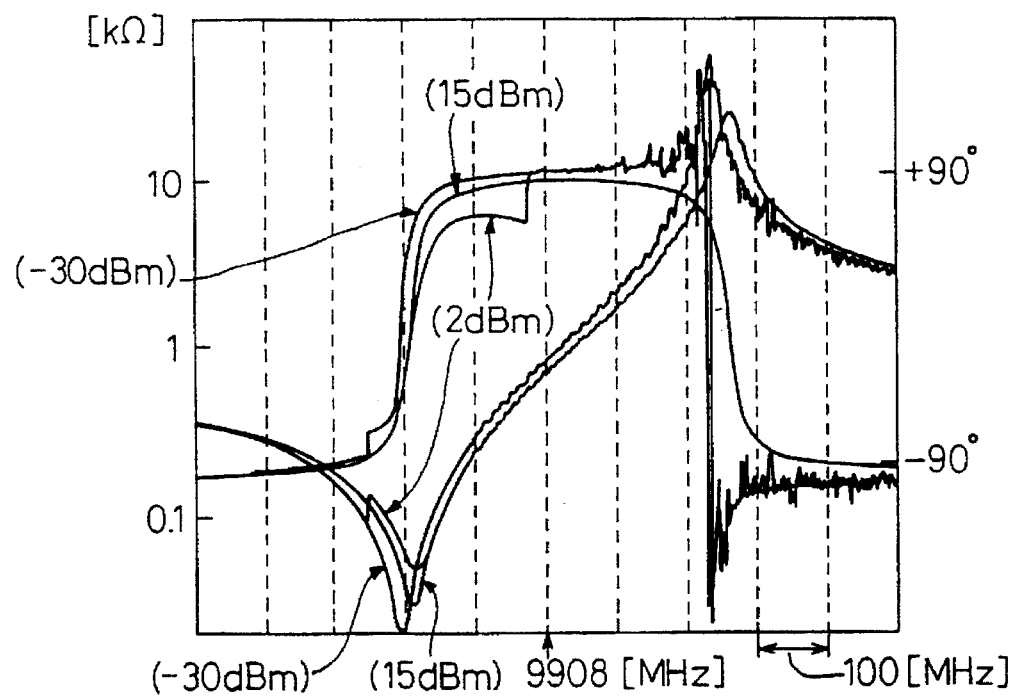
FIG. 5 is a graph showing a fourth example of a change in impedance characteristics in dependence on the driving level.

Case 2: where a vibrator with a certain fluctuation is driven at intermediate level (see FIG. 5).

As shown in FIG. 5, in a lower frequency range, the curve at the intermediate level (2 dBm) driving conforms to the curve at the low level (−30 dBm) driving. Also, in a frequency range lying in close vicinity of the resonant frequency, the curve at the intermediate level (2 dBm) driving is shifted from the curve at the low level (−30 dBm) driving to the curve at the high level (15 dBm) driving. Furthermore, in a frequency range between the resonant frequency and the antiresonant frequency, the curve at the intermediate level driving is re-shifted from the curve at the low level driving to the curve at the high level driving. Also, in a frequency range higher than the antiresonant frequency, the curve at the intermediate level (2 dBm) driving conforms to the curve at the low level (−30 dBm) driving.

As explained above, according to the prior art method of testing characteristics of a vibrator by changing a driving level thereof, a problem occurs in that impedance responses (i.e., frequency characteristics) of the vibrator fluctuate depending on the driving level thereof. This imposes restrictions on the manner of choice of a driving power source when the device is in use, and thus is not preferable.

Figure 6A:
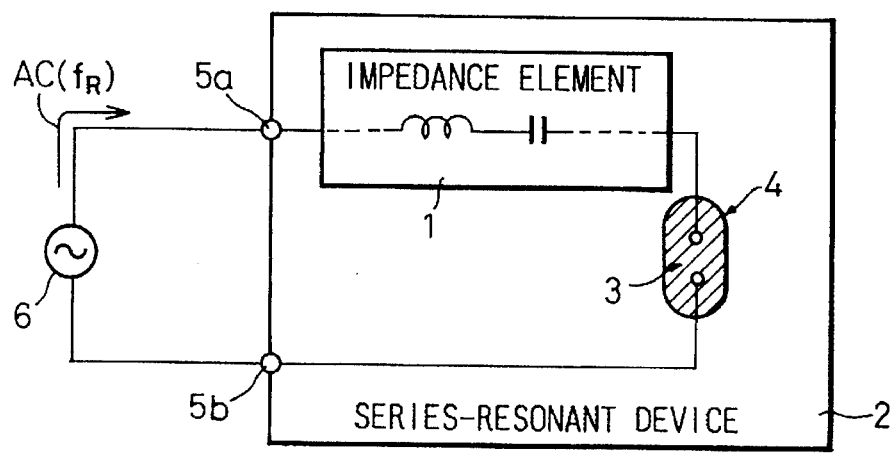
FIGS. 6a to 6c are explanatory diagrams of the principle of the method of producing a series-resonant device using conductive adhesive resin, according to the present invention.
Figure 6B:
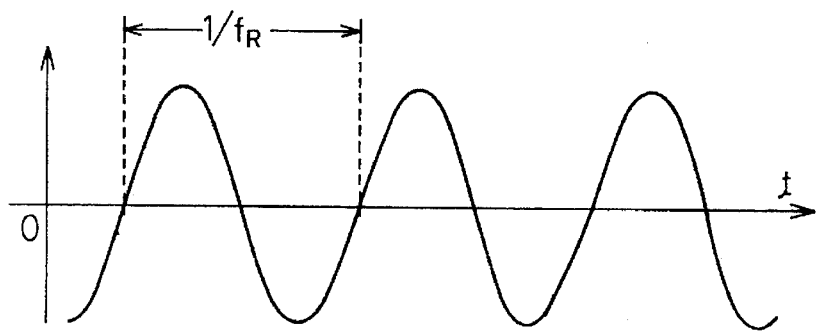
Figure 6C:
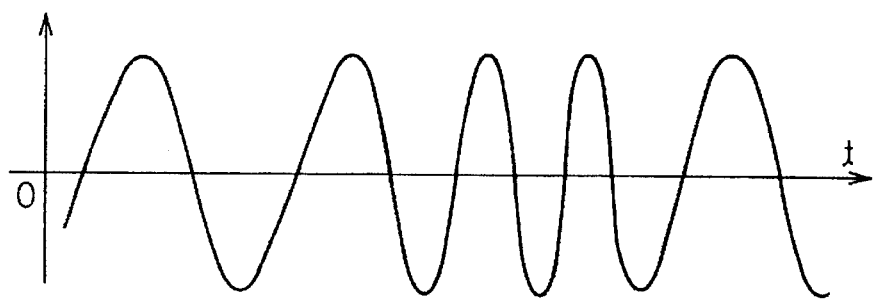

FIGS. 6a to 6c show the principle of the method of producing a series-resonant device using conductive adhesive resin, according to the present invention.

The method according to the present invention includes a step of connecting connection portions 3 such as terminals or electrodes to be electrically connected in a device 2 including an impedance element 1 provided so as to effect a series resonance, using conductive adhesive resin 4. The step includes a sub-step of applying an alternating current signal AC which has a frequency lying in close vicinity of a resonant frequency $f_R$ of the device 2, and which has an enough amplitude to destroy an insulation film (not shown) parasitically formed in the conductive adhesive resin 4, to input/output terminals 5a and 5b of the device 2.

FIG. 6b shows a waveform of the alternating current signal AC applied to the input/output terminals 5a and 5b.

Also, as shown in FIG. 6c, the step of connecting connection portions 3 may include a sub-step of scanning a frequency of the alternating current signal AC while applying the alternating current signal AC having a frequency lying in close vicinity of the resonant frequency $f_R$ to the input/output terminals 5a and 5b of the device 2.

Also, in a preferred aspect of the invention, the step of connecting connection portions 3 includes a sub-step of using a power source 6 having an internal impedance equal to or less than a resonant resistance of the device 2 when applying the alternating current signal AC having a frequency lying in close vicinity of the resonant frequency $f_R$ to the input/output terminals 5a and 5b of the device 2.

According to the above method of the present invention, the alternating current signal voltage (AC) having a frequency lying in close vicinity of the specific frequency (i.e., resonant frequency $f_R$) is effectively applied to the insulation film parasitically formed in the conductive adhesive resin 4, and thus the insulation film is destroyed.

Namely, current flows at a burst to thereby cause a metal contact between metal particles (or metal films) such as silver particles contained in the conductive adhesive resin, and thus a resistance of the metal contact portion is lowered. In this case, even if the applied signal is a small amplitude signal, current flows considerably through the metal contact portion. As a result, it is possible to suppress a fluctuation in frequency response characteristics in dependence on the driving level of the power source 6.

Thus, it is possible to substantially remove a fluctuation in characteristics of the device in dependence on the magnitude of the driving level thereof, and thus to realize a stable operation of the device.

Also, since the insulation film parasitically formed in the conductive adhesive resin is destroyed to thereby lower a resistance value of the destroyed portion, it is possible to improve an electric connection state at the connection portion. Namely, it is possible to remove an incomplete electric contact state to thus heighten the electric conductivity.

Next, the method of producing a series-resonant device using conductive adhesive resin, according to the present invention, will be explained in detail with reference to FIGS. 7a to 9b. Note, the description given below treats the case where the invention is applied to a method of producing a piezoelectric device (piezoelectric vibrator) using silver paste as the conductive adhesive resin.

First, the present inventors studied phenomena of the aforementioned level fluctuation prior to implementation of the present invention.

In general, there is an insulation film surely present at the contact interface between two metals. In an ordinary manner of connection or contact, such an insulation film can be destroyed by mechanical contact force. On the other hand, where there are metal particles (in this case, silver particles) within the conductive adhesive resin such as silver paste, a thin insulation film is present between one silver particle and the resin. Such a thin film is generally said to be penetrated by tunnel effect, and a thick film of some degree is said to exhibit a Schottky diode-like behavior. Also, an element with a point connection, as if a needle were contacted on such a thin film, can exhibit inductive characteristics. In other words, such a point connection portion exhibits inductive characteristics since current is concentrated thereon.

Figure 7A:
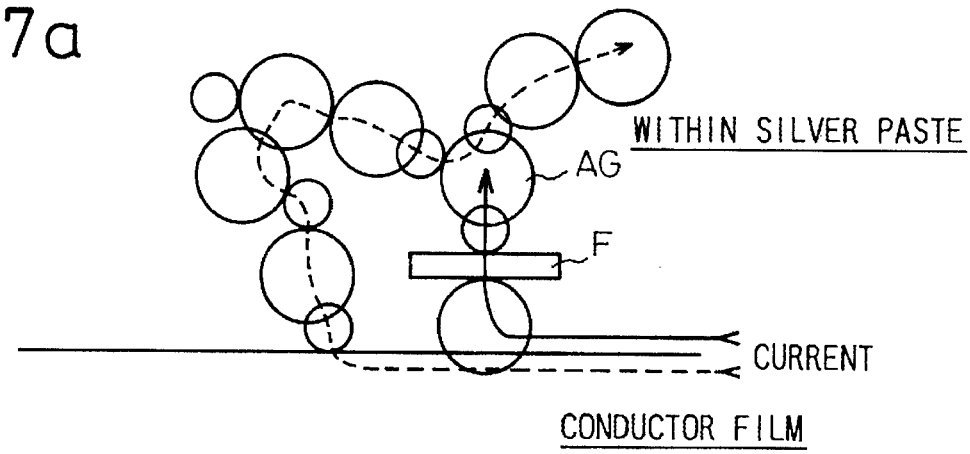
FIGS. 7a to 7d are diagrams illustrating the constitution of a connection portion within a piezoelectric device produced by the method according to the present invention.

In view of this, the present inventors proposed a model of one connection portion as illustrated in FIG. 7a. In the illustration, an arrow mark shown by a solid line indicates current flowing in a great amplitude operation, and an arrow mark shown by a broken line indicates current flowing in a small amplitude operation.

As shown in FIG. 7a, a probability that silver particles (indicated by reference AG) are in metal contact with each other in some portions within the silver paste is relatively high. In this case, where the length of metal contact is too long, tunnel current or Schottky current flows through the contacted portion when the threshold voltage is exceeded. Also, where there is an insulation film (indicated by reference F) present between silver particles AG (or conductive thin films), tunnel current or Schottky current flows through the insulation film portion, and thus the insulation film F exhibits diode-like characteristics. On the other hand, the connection between the silver particles AG is a kind of point connection, and thus a certain inductance is formed at the point connection portion. In this case, if the area of the insulation film F is small and the entire silver paste has a good electric conductivity, the insulation film F can exhibit inductive characteristics with respect to a small amplitude signal.

Figure 7B:
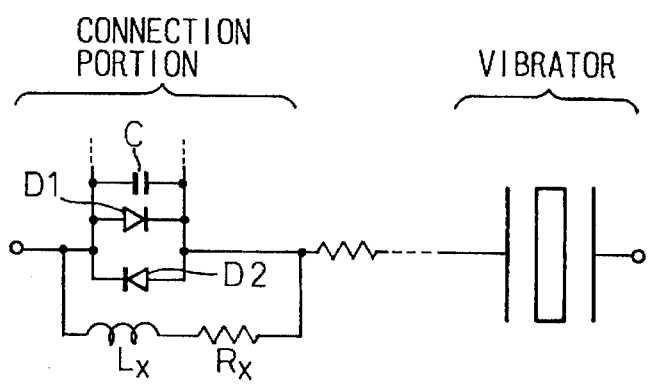
Figure 7C:
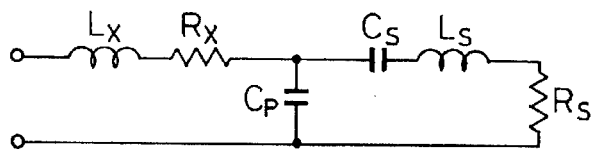
Figure 7D:
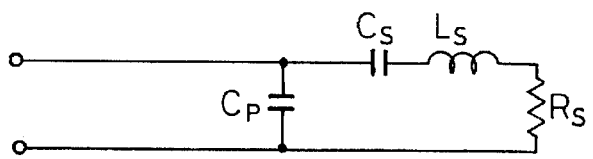

FIGS. 7b to 7d illustrate the equivalent circuits of the connection portion including a vibrator, respectively.

As shown in FIG. 7b, the connection portion can be expressed by two diodes D1 and D2 connected in parallel and in a reverse direction to each other, a capacitor (capacitance C), and an inductor (inductance Lx) and a resistor (resistance Rx) connected in series with each other.

Also, the equivalent circuit in the case where the diodes D1, D2 are in a cut-off state by a small amplitude driving can be expressed as shown in FIG. 7c, and the equivalent circuit in the case where the diodes D1, D2 are in a cut-off state by a great amplitude driving can be expressed as shown in FIG. 7d.

Next, the present inventors studied characteristics of the connection portion in dependence on the driving frequency.

First, where the driving frequency is a direct current or extremely low frequency, only a resistance component of the diode becomes effective, and thus the diode characteristics hardly appear. Accordingly, it is very difficult to destroy an insulation film (i.e., a parasitically formed diode) using a driving signal with such a direct current or extremely low frequency.

Next, where the driving frequency is a relatively high frequency, an influence by the inductance appears. Namely, contribution of the diode distinctly appears. Accordingly, such a frequency range (high frequency range) poses a problem in an actual use of the device.

Furthermore, where the driving frequency is an ultra-high frequency, the impedance of the diode becomes decreased due to working of the capacitance depending on the frequency, and thus the diode characteristics do not appear. Accordingly, such an ultra-high frequency range poses no problem in an actual use of the device.

Next, the present inventors studied a change in characteristics of the vibrator in dependence on the inductance of the connection portion. Note, the great amplitude driving corresponds to FIG. 7d, and the small amplitude driving corresponds to FIG. 7c.

In the equivalent circuits illustrated in FIGS. 7b to 7d, assuming that: fx indicates a resonant frequency in the presence of the inductance Lx (this corresponds to the case of a small amplitude driving); of indicates a resonant frequency in the absence of the inductance Lx (this corresponds to the case of a great amplitude driving); and $\gamma = Cp/Cs$ (Cp is a damping capacitance of the vibrator, and Cs is an acoustic capacitance thereof), shift quantity of the resonant frequency can be expressed as follows.

$$(fx-f_o)/f_o = 1/(2\gamma) \times 1/[1 - 1/(\omega_o^2 \, Cp \, Lx)]$$

Figure 8:
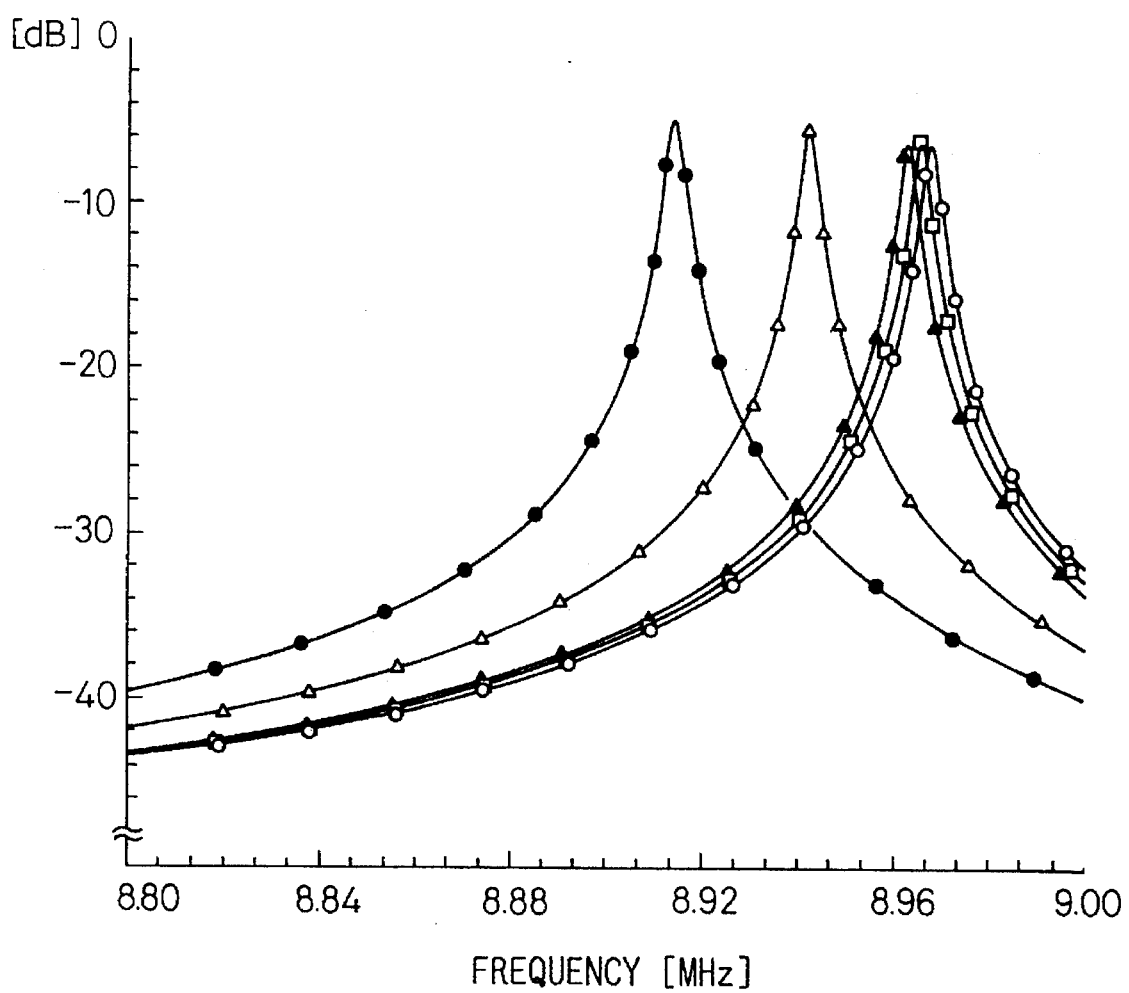
FIG. 8 is a graph showing a change in impedance responses in dependence on the inductance of the connection portion, based on simulation results.

FIG. 8 shows an example of simulation results representing a change in impedance responses in dependence on the inductance Lx of the connection portion, i.e., a change in the resonant resistance relative to the resonant frequency shift.

Due to presence of the inductance Lx, the resonant frequency exhibits a tendency to become low and the resonant resistance exhibits a tendency to become smaller. However, the resonant resistance is actually increased due to presence of the series resistance Rx. Also, where a capacitance is coupled in series with the inductance, the resonant resistance is still increased.

It is now assumed that the diode is brought to a conduction state at the driving level of 10 dBm and to a cut-off state at the driving level of −30 dBm. Under the conditions, when the results of the above study are applied to the measured results regarding the aforementioned vibrator with a certain level fluctuation, values of each element are determined as follows:

In the case of FIG. 3, the resonant resistance shift (indicated by reference ΔR) is approximately 140 Ω, and the frequency shift (indicated by reference Δf) is approximately 11.6 KHz. Accordingly, it is possible to regard the value of Lx as 1.7 μH, and the value of Rx as 140 Ω.

Also, in the case of FIG. 4, the resonant resistance shift is approximately 6 Ω, and the frequency shift is approximately 2.2 KHz. Accordingly, it is possible to regard the value of Lx as 0.32 μH, and the value of Rx as 6 Ω.

From the above study, it is appreciated that, where the insulation film F (see FIG. 7a), which is present within the silver paste and may cause a poor contact, can be destroyed, it will be possible to suppress a fluctuation in characteristics in dependence on the magnitude of the driving level.

In view of this, the method according to the present invention includes a step of applying a specific voltage to the insulation film portion concerned. In this case, an alternating current signal voltage having a frequency lying in close vicinity of the resonant frequency is applied to the piezoelectric vibrator in the same manner as in an actual use of the device. As a result, the alternating current signal voltage is effectively applied to the insulation film portion to thereby destroy the insulation film.

On the other hand, where the frequency of the alternating current signal voltage to be applied departs out of a range lying in close vicinity of the resonant frequency, no current flows and a greater part of the voltage is applied to the piezoelectric vibrator. Namely, the alternating current signal voltage is not effectively applied to the insulation film portion to be destroyed.

In conclusion, the alternating current signal to be applied to the device must have a frequency lying in close vicinity of the resonant frequency of the device.

Hereinafter, concrete embodiments using the method according to the present invention will be described.

(a) Selection of the alternating current signal to be applied for destroying the insulation film:

Regarding the application frequency, a frequency lying in the range of 9.8 MHz to 10 MHz was applied for approximately 10 seconds by manual scanning (see the manner of application shown in FIG. 6c).

Also, regarding the application voltage (peak value voltage), it is necessary to select the same to be an appropriate voltage value. This is because where the application voltage is too high, the piezoelectric device (piezoelectric vibrator) may be destroyed, and because where the application voltage is too low, the insulation film cannot be effectively destroyed. Some examples are described below.

① When the application voltage was 15 V with respect to five sample devices, four sample devices were all right and one sample device was destroyed. At this time, the current value of the alternating current signal was 30 mA to 300 mA and the resonant resistance was 5 Ω to 50 Ω.

② When the application voltage was 8 V with respect to eight sample devices, all of the sample devices were all right. At this time, the current value of the alternating current signal was 16 mA to 160 mA.

③ When the application voltage was 5 V with respect to six sample devices, all of the sample devices were all right. At this time, the current value of the alternating current signal was 10 mA to 100 mA.

④ When the application voltage was 1 V with respect to ten sample devices, two sample devices were all right, and regarding the remaining eight sample devices, it was impossible to restore the same to the former state. At this time, the current value of the alternating current signal was 2 mA to 20 mA.

(b) An example of improvement in characteristics under application of the alternating current signal of 5 V (in use of a power source having an internal impedance of 50 Ω):

Table 1 described below indicates an example of characteristics before processing (i.e., in the case where the present invention is not applied), and Table 2 indicates an example of improvement in characteristics after processing (i.e., in the case where the present invention was applied).

TABLE 1

(before processing)

| No. | fr [Hz] (−20 dBm) | fr [Hz] (10 dBm) | Δfr | Rs[Ω] (−20 dBm) | Rs[Ω] (10 dBm) | ΔRs |
|---|---|---|---|---|---|---|
| 1 | 9888250 | 9888250 | 0 | 33.0 | 28.9 | 4.1 |
| 2 | 9889500 | 9882500 | 7000 | 39.0 | 19.1 | 19.9 |
| 3 | 9889750 | 9894500 | 4750 | 190.0 | 27.4 | 162.0 |
| 4 | 9890500 | 9892500 | 2000 | 23.2 | 21.9 | 1.3 |
| 5 | 9891000 | 9893250 | −2250 | 40.7 | 29.2 | 11.5 |
| 6 | 9888000 | 9888500 | −500 | 14.8 | 15.5 | −0.7 |

TABLE 2

(after processing)

| No. | fr [Hz] (−20 dBm) | fr [Hz] (10 dBm) | Δfr | Rs[Ω] (−20 dBm) | Rs[Ω] (10 dBm) | ΔRs |
|---|---|---|---|---|---|---|
| 1 | 9888500 | 9888500 | 0 | 28.0 | 28.1 | 0.1 |
| 2 | 9887250 | 9887250 | 0 | 17.4 | 16.8 | 0.6 |
| 3 | 9889750 | 9889750 | 0 | 25.5 | 25.4 | 0.1 |
| 4 | 9891000 | 9890750 | 250 | 23.0 | 21.4 | 1.6 |
| 5 | 9893250 | 9893000 | 250 | 29.3 | 28.5 | 0.8 |
| 6 | 9888900 | 9888900 | 0 | 15.0 | 14.7 | 0.3 |

In Tables 1 and 2, reference fr denotes a resonant frequency; reference Δfr a fluctuation of the resonant frequency; reference Rs denotes a resonant resistance; and reference ΔRs a fluctuation of the resonant resistance. As shown in Table 2, the resonant resistance at the resonant frequency is within the range of 10 Ω to 30 Ω. In view of this, to effectively apply a voltage to an insulation film to be destroyed, it is necessary to use an alternating current power source having an internal impedance equal to or less than the resonant resistance.

Figure 9A:
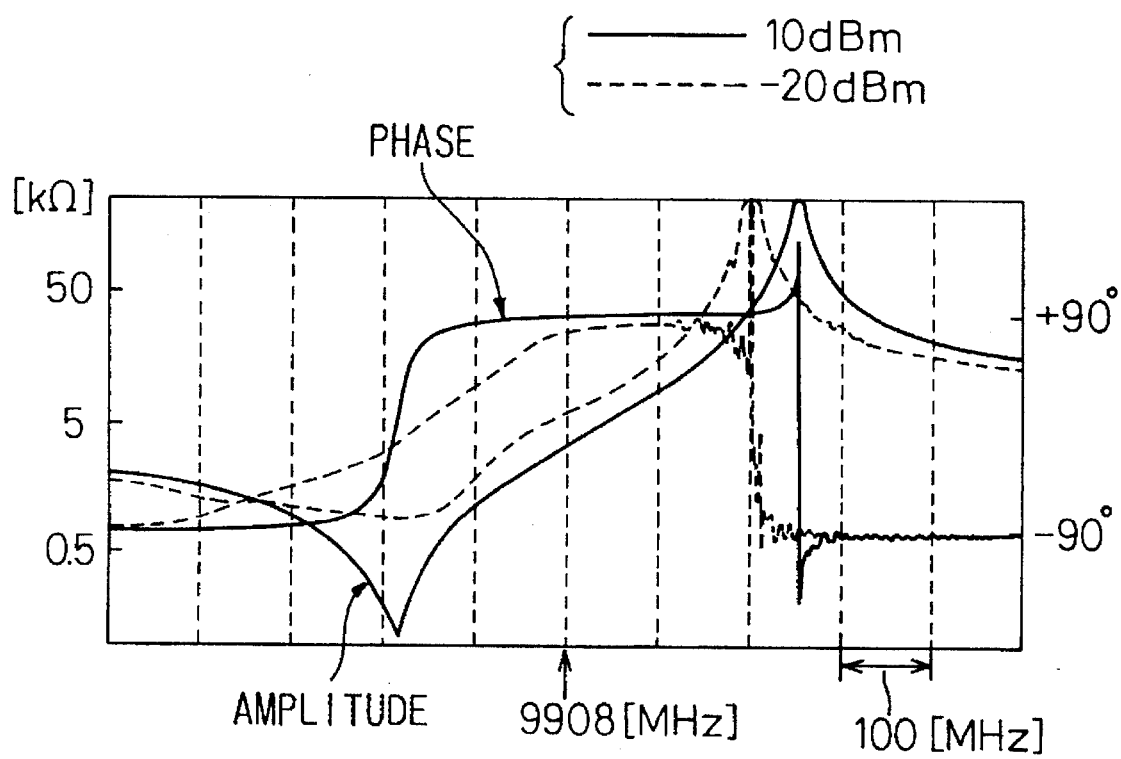
FIGS. 9a and 9b are graphs showing a change in impedance characteristics in dependence on the driving level, respectively.
Figure 9B:
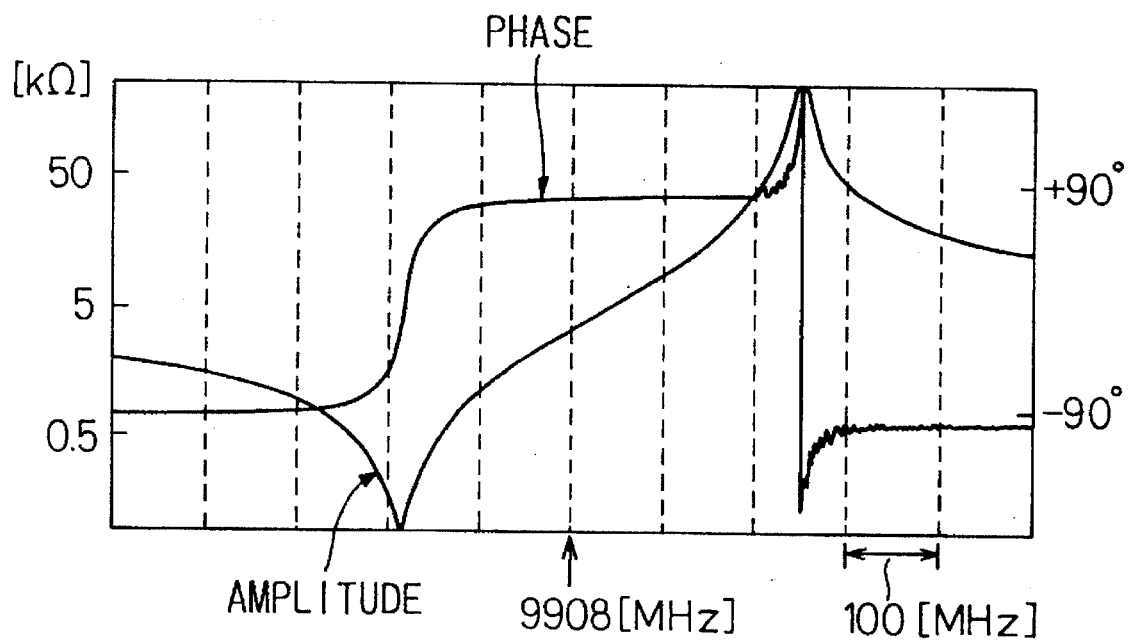

FIGS. 9a and 9b show changes in impedance characteristics in dependence on the driving level, respectively. FIG. 9a corresponds to the above Table 1, and FIG. 9b corresponds to the above Table 2.

As shown in FIG. 9b, by the present embodiment, it is possible to improve the frequency response characteristics. Namely, it is possible to substantially remove the difference in characteristics between the low level (−20 dBm) driving and the high level (10 dBm) driving, and thus to remove a fluctuation in the characteristics in dependence on the driving level. In particular, in the case of the low level (−20 dBm) driving, a remarkable improvement can be seen in the resonant resistance.

Also, since the insulation film parasitically formed in the silver paste is destroyed to thereby lower a resistance value of the destroyed portion, it is possible to heighten the electric conductivity at the connection portion.

What is claimed is:

1. A method of producing a device including an impedance element provided so as to effect a series resonance, the method comprising:

a step of connecting at least two connection portions to be electrically connected in said device, using conductive adhesive resin, said step of connecting connection portions including a sub-step of applying an alternating current signal to input/output terminals of said device, said alternating current signal having a frequency lying in close vicinity of a resonant frequency of said device, and having an amplitude sufficient to destroy an insulation film parasitically formed in said conductive adhesive resin.

2. The method according to claim 1, wherein said step of connecting connection portions further includes a sub-step of scanning a frequency of said alternating current signal while applying the alternating current signal having a frequency lying in close vicinity of said resonant frequency to the input/output terminals of said device.

3. The method according to claim 1, wherein said step of connecting connection portions further includes a sub-step of using a power source having an internal impedance equal to or less than a resonant resistance of said device when applying the alternating current signal having a frequency lying in close vicinity of said resonant frequency to the input/output terminals of said device.

4. The method according to claim 1, wherein said conductive adhesive resin includes silver paste.

5. The method according to claim 1, wherein said device comprises a piezoelectric device.

6. The method of claim 1, wherein said at least two connection portions are terminals.

7. The method of claim 1, wherein said at least two connection portions are electrodes.

8. A method of producing a piezoelectric device provided with a chip vibrator composed of piezoelectric material, the method comprising:

a step of fixing and electrically connecting driving electrodes of said chip vibrator to corresponding electrodes formed on a substrate, using conductive adhesive resin, said step of fixing and electrically connecting driving electrodes including a sub-step of applying an alternating current signal to external electrodes connected to the electrodes formed on said substrate, said alternating current signal having a frequency lying in close vicinity of a resonant frequency of said chip vibrator, and having an amplitude sufficient to destroy an insulation film parasitically formed in said conductive adhesive resin.

9. The method according to claim 8, wherein a current value of the alternating current signal having a frequency lying in close vicinity of said resonant frequency applied to the external electrodes of said device is selected to be within the range of 10 mA to 1 A.

10. The method according to claim 8, wherein said conductive adhesive resin includes silver paste.

* * * * *